United States Patent
Hellmund et al.

(10) Patent No.: US 11,011,409 B2
(45) Date of Patent: May 18, 2021

(54) DEVICES WITH BACKSIDE METAL STRUCTURES AND METHODS OF FORMATION THEREOF

(71) Applicant: Infineon Technologies AG, Neubiberg (DE)

(72) Inventors: Oliver Hellmund, Neubiberg (DE); Ingo Muri, Villach (AT); Johannes Baumgartl, Riegersdorf (AT); Iris Moder, Villach (AT); Thomas Christian Neidhart, Klagenfurt (AT); Hans-Joachim Schulze, Taufkirchen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/695,999

(22) Filed: Nov. 26, 2019

(65) Prior Publication Data

US 2020/0098617 A1    Mar. 26, 2020

Related U.S. Application Data

(62) Division of application No. 15/951,995, filed on Apr. 12, 2018, now Pat. No. 10,535,553, which is a
(Continued)

(51) Int. Cl.
*H01L 29/417*    (2006.01)
*H01L 21/762*    (2006.01)
(Continued)

(52) U.S. Cl.
CPC ........ *H01L 21/76248* (2013.01); *H01L 21/28* (2013.01); *H01L 21/30608* (2013.01); *H01L 21/30625* (2013.01); *H01L 21/31111* (2013.01); *H01L 21/743* (2013.01); *H01L 21/764* (2013.01); *H01L 21/76272* (2013.01); *H01L 21/76283* (2013.01); *H01L 29/1608* (2013.01); *H01L 29/4236* (2013.01); *H01L 29/66136* (2013.01); *H01L 29/66143* (2013.01);
(Continued)

(58) Field of Classification Search
CPC .......... H01L 29/66287; H01L 29/0843; H01L 29/0869; H01L 29/0886; H01L 29/41; H01L 29/41725; H01L 29/41708; H01L 29/41716; H01L 29/41766
See application file for complete search history.

(56) References Cited

U.S. PATENT DOCUMENTS

| 9,960,076 B2 | 5/2018 | Hellmund et al. |
| 2009/0085166 A1* | 4/2009 | Iwamuro ........... H01L 21/02502 257/615 |

(Continued)

FOREIGN PATENT DOCUMENTS

| CN | 102856246 A | 1/2013 |
| CN | 103871952 A | 6/2014 |

*Primary Examiner* — Jae Lee
(74) *Attorney, Agent, or Firm* — Slater Matsil, LLP

(57) ABSTRACT

A semiconductor device includes a first epitaxial layer, a second epitaxial layer disposed below the first epitaxial layer, a conductive layer disposed below and directly contacting the second epitaxial layer, and a plurality of spacers disposed between the second epitaxial layer and the conductive layer. The conductive layer includes a metal. The plurality of spacers include a bulk semiconductor material.

20 Claims, 15 Drawing Sheets

Related U.S. Application Data division of application No. 15/229,985, filed on Aug. 5, 2016, now Pat. No. 9,960,076.

(51) Int. Cl.

| | |
|---|---|
| *H01L 29/861* | (2006.01) |
| *H01L 29/16* | (2006.01) |
| *H01L 29/66* | (2006.01) |
| *H01L 21/764* | (2006.01) |
| *H01L 29/872* | (2006.01) |
| *H01L 21/74* | (2006.01) |
| *H01L 21/28* | (2006.01) |
| *H01L 21/306* | (2006.01) |
| *H01L 21/311* | (2006.01) |
| *H01L 29/423* | (2006.01) |
| *H01L 29/78* | (2006.01) |
| *H01L 21/3105* | (2006.01) |

(52) U.S. Cl.
CPC .... *H01L 29/66666* (2013.01); *H01L 29/7827* (2013.01); *H01L 29/861* (2013.01); *H01L 29/872* (2013.01); *H01L 21/31053* (2013.01)

(56) References Cited

U.S. PATENT DOCUMENTS

| | | |
|---|---|---|
| 2011/0147883 A1 | 6/2011 | Schulze et al. |
| 2012/0326320 A1 | 12/2012 | Hong |
| 2013/0252146 A1 | 9/2013 | Hetzler et al. |
| 2013/0299950 A1 | 11/2013 | Hummler |
| 2014/0167209 A1 | 6/2014 | Meiser et al. |
| 2016/0379887 A1 | 12/2016 | Basker et al. |
| 2017/0133465 A1 | 5/2017 | Mauder et al. |
| 2018/0040504 A1 | 2/2018 | Hellmund et al. |
| 2018/0233399 A1 | 8/2018 | Hellmund et al. |

* cited by examiner

US 11,011,409 B2

DEVICES WITH BACKSIDE METAL STRUCTURES AND METHODS OF FORMATION THEREOF

This application is a divisional application of U.S. application Ser. No. 15/951,995, filed Apr. 12, 2018, entitled "Devices with Backside Metal Structures and Methods of Formation Thereof", which is a divisional application of U.S. application Ser. No. 15/229,985, entitled "Devices with Backside Metal Structures and Methods of Formation Thereof" issued as U.S. Pat. No. 9,960,076 on May 1, 2018, which applications are hereby incorporated herein by reference in their entirety.

TECHNICAL FIELD

The present invention relates generally to a semiconductor process, and, in particular embodiments, to devices with backside metal structures and methods of formation thereof.

BACKGROUND

Semiconductor devices are used in a variety of electronic and other applications. Well-defined and highly stable oxide and metal structures are important for the fabrication of semiconductor devices. A particularly useful oxide structure is a buried oxide (BOX) structure which is an oxide structure within a semiconductor substrate. BOX structures can be used as isolation layers and etch stops, for example. A common substrate for the formation of BOX structures is a silicon-on-insulator (SOI) wafer. SOI wafers have a BOX layer sandwiched between semiconductor layers, but have a high manufacturing cost due to additional wafer processing such as separation by implantation of oxygen (SIMOX) or Smart Cut processes.

SUMMARY

In accordance with an embodiment of the present invention, a method of fabricating a semiconductor device, the method includes forming trenches filled with a sacrificial material. The trenches extend into a semiconductor substrate from a first side. An epitaxial layer is formed over the first side of the semiconductor substrate and the trenches. From a second side of the semiconductor substrate opposite to the first side, the sacrificial material in the trenches is removed. The trenches are filled with a conductive material.

In accordance with another embodiment of the present invention, a method of fabricating a semiconductor device includes forming trenches filled with a conductive material. The trenches extend into a semiconductor substrate from a first side. An epitaxial layer is formed over the first side of the semiconductor substrate and the trenches. The semiconductor substrate is thinned, from a second side of the semiconductor substrate opposite to the first side, to expose the conductive material. From the second side, a back side contact material layer is deposited over the conductive material.

In accordance with another embodiment of the present invention, a method of fabricating a semiconductor device includes forming trenches in a semiconductor substrate from a first side. The semiconductor substrate includes a second side opposite to the first side. The trenches are oxidized to form an oxide liner. A fill material is deposited using a chemical vapor deposition process. The fill material and the underlying oxide liner are etched to expose a top surface of the semiconductor substrate at the first side. The etching removing portions of the fill material and the oxide liner from top portions of the trenches. Device regions are formed over the semiconductor substrate. The semiconductor substrate is thinned from the second side. The fill material and the oxide liner are removed from within the trench. The trench is filled with a contact metal.

In accordance with another embodiment of the present invention, a semiconductor device includes a trench extending through a semiconductor substrate. An epitaxial layer is disposed over a first side of the semiconductor substrate. The epitaxial layer partially fills a portion of the trench. A back side metal layer is disposed over a second side of the semiconductor substrate. The back side metal layer extends into the trench and filling the remaining portion of the trench, where the epitaxial layer partially filling the trench contacts the back side metal layer filling the remaining portion within the trench.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A and 3B illustrates a semiconductor device comprising a plurality of devices on a single substrate in accordance with an embodiment of the present invention, wherein FIG. 3A illustrates a cross-sectional view and FIG. 3B illustrates a top-sectional view;

FIGS. 8A-8D and 9A-9H illustrate an embodiment of forming a substrate comprising backside metal structures using BOX structures in accordance with an embodiment of the present invention, wherein FIG. 8A illustrates a cross-sectional view of a substrate after forming deep trenches, wherein FIG. 8B illustrates an embodiment of a top view of the substrate after forming deep trenches, wherein FIG. 8C illustrates an alternative embodiment of a top view of the substrate after forming deep trenches, wherein FIG. 8D illustrates another alternative embodiment of a top view of the substrate after forming deep trenches, wherein FIG. 9A illustrates a cross-sectional view of the substrate after formation of a liner, wherein FIG. 9B illustrates a cross-sectional view of the substrate after formation of a fill layer, wherein FIG. 9C illustrates a cross-sectional view of the substrate after a polishing process that removes part of the fill layer and the liner, wherein FIG. 9D illustrates a cross-sectional view of the substrate after formation of a first epitaxial layer, wherein FIG. 9E illustrates a cross-sectional view of the substrate after formation of a second epitaxial layer, wherein FIG. 9F illustrates a cross-sectional view of the substrate comprising BOX structures after exposure of the BOX structures using a back side etching step, wherein FIG. 9G illustrates a cross-sectional view of the substrate after removal of the BOX structures using a back side etching step, and wherein FIG. 9H illustrates a cross-sectional view of the substrate after deposition of a metal layer in accordance with an embodiment of the present invention;

FIGS. 10A-10C illustrate an alternative embodiment of forming a substrate comprising backside metal structures using BOX structures in accordance with an embodiment of the present invention, wherein FIG. 10A illustrates a cross-sectional view of a substrate comprising BOX structures after exposure of the BOX structures using a chemical mechanical planarization (CMP) step, wherein FIG. 10B illustrates a cross-sectional view of the substrate after removal of BOX structures using an etching step, and wherein FIG. 10C illustrates a cross-sectional view of the substrate after deposition of metal layers;

FIGS. 11A-11C illustrate an alternative embodiment of forming BOX structures in accordance with embodiments of the present invention, wherein FIG. 11A illustrates a cross-sectional view of a substrate comprising deep trenches filled with a fill layer, wherein FIG. 11B illustrates a cross-sectional view of the substrate comprising BOX structures after exposure of the BOX structures using an etching step, and wherein FIG. 11C illustrates a cross-sectional view of the substrate comprising BOX structures after exposure of the BOX structures using a CMP step;

FIGS. 12A-12C illustrate an alternative embodiment of forming BOX structures in accordance with embodiments of the present invention, wherein FIG. 12A illustrates a cross-sectional view of a substrate comprising deep trenches filled with a liner and a fill layer and having a void region within the fill layer, wherein FIG. 12B illustrates a cross-sectional view of the substrate comprising BOX structures after exposure of the BOX structures using an etching step, and wherein FIG. 12C illustrates a cross-sectional view of the substrate comprising BOX structures after exposure of the BOX structures using a CMP step.

DETAILED DESCRIPTION OF ILLUSTRATIVE EMBODIMENTS

It is advantageous to form BOX structures in bulk substrates rather than SOI substrates, for example, to reduce fabrication costs. However, many of the methods of forming buried oxide (BOX) structures on conventional bulk semiconductor wafers have various drawbacks and limitations.

One way of forming BOX structures on bulk semiconductor wafers is by first depositing the oxide onto the substrate, then structuring the oxide by lithography, and finally covering the oxide structures by epitaxial lateral overgrowth (ELO). In the case of oxide deposition followed by lithographic structuring, oxide structures are formed having sidewalls with large topographical variation and a rough top surface. Large topographical variation of sidewalls and rough surfaces increase the risk of generating crystal defects during the subsequent epitaxial lateral overgrowth (ELO) process. Additionally, the height of the oxide features above the substrate requires extensive overgrowth resulting in increased processing time. Another way of forming BOX structures involves creating trenches in the substrate, then forming an oxide layer using thermal oxidation, and finally covering the oxide layer using ELO. In contrast, the method of thermally oxidizing the bottom surface of trenches produces very thin BOX structures that subsequently have the sidewall oxide removed. The presence of thermal oxide only in the trenches can also generate mechanical stress which can lead to warping of the substrate. In both cases, the BOX structures are too thin to be used as an etch stop while using wet etch techniques for etching the substrate in between the BOX structures.

Embodiments of the present invention improve upon the methods of forming BOX structures on bulk semiconductor wafers through novel processing methods described herein.

According to various embodiments, the present invention discloses various methods of forming BOX structures within a bulk substrate. The following description describes the various embodiments. Exemplary embodiments for devices utilizing backside metal structures are described using FIGS. 1-7. An embodiment for forming metal structures on the backside of the wafer by producing BOX structures using ELO processes and exposing the BOX structures with an etching step will be described using FIGS. 8-9. An alternative embodiment for forming metal structures on the backside of the wafer using a chemical mechanical planarization (CMP) step will be described in FIG. 10. Additional embodiments for forming different types of BOX structures will be described in FIGS. 11-13.

Figure 1:
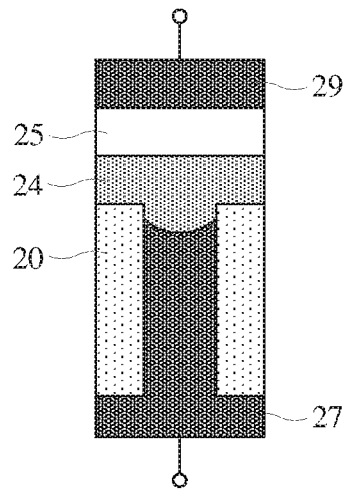
FIG. 1 illustrates a cross-sectional view of a semiconductor device having backside metal structures in accordance with an embodiment of the present invention.
Figure 2:
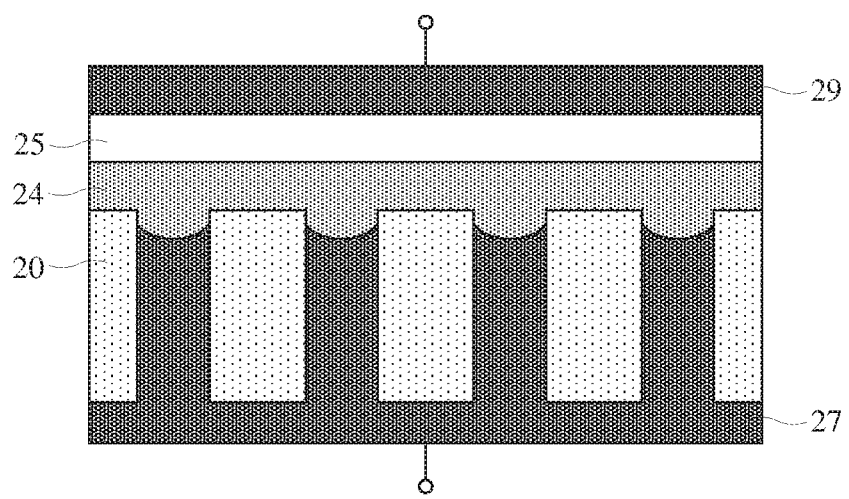
FIG. 2 illustrates a cross-sectional view of an alternative embodiment of a semiconductor device having backside metal structures.

FIGS. 1-3 illustrate semiconductor devices having backside metal structures in accordance with embodiments of the present invention.

FIG. 1 illustrates a cross-sectional view of an embodiment semiconductor device while FIG. 2 illustrates a cross-sectional view of an alternative embodiment semiconductor device.

The semiconductor device, in various embodiments, may include active devices as well as passive devices. The semiconductor device may be a power semiconductor device. Examples of power semiconductor devices include discrete PN diodes, Schottky diodes, junction gate field-effect transistors, metal-oxide-semiconductor field effect transistors, bipolar junction transistors, insulated-gate bipolar transistors, depletion enhancement metal-oxide-semiconductor field effect transistors, lateral double-diffused metal-oxide-semiconductor field effect transistors, and others. The power semiconductor device may be wideband semiconductor device such as silicon carbide and gallium nitride.

Referring to FIGS. 1 and 2, the semiconductor devices comprise a bottom contact 27, a first doped layer 24, a second doped layer 25, and a top contact 29. In one embodiment, the first doped layer 24 and the second doped layer 25 have opposite types of doping forming a p-n junction at the interface of the first doped layer 24 and the second doped layer 25 and the device is a diode. In one embodiment, the second doped layer 25 forms a Schottky diode with the top contact 29. In another embodiment, the second doped layer 25 forms an Ohmic contact with the top contact 29.

The semiconductor device further comprises semiconductor spacers 20 which provide structure to the bottom contact 27 and stability to the device. However, they do not take part in the electrical functionality of the device. In one embodiment, the semiconductor spacers 20 are formed from the initial semiconductor substrate during fabrication of the device. In one embodiment, a single structured formation of the bottom contact 27 makes contact with the first doped layer 24 as in FIG. 1. Accordingly, the semiconductor device of FIG. 1 has a single contact surface with the first doped layer 24. In another embodiment, a plurality of structured formations of the bottom contact 27 separated by semiconductor spacers 20 make contact with the first doped layer 24 as in FIG. 2. In another embodiment, the first doped layer 24 may partially be located between the spacers 20.

Figure 3A:
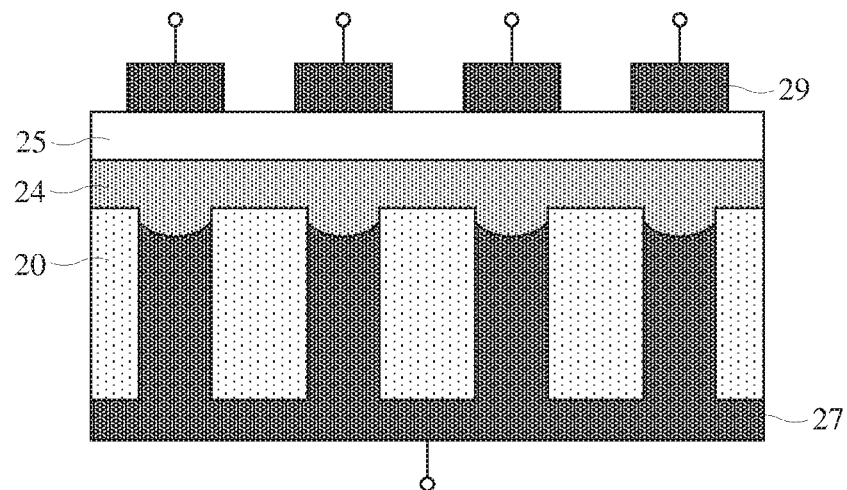
Figure 3B:
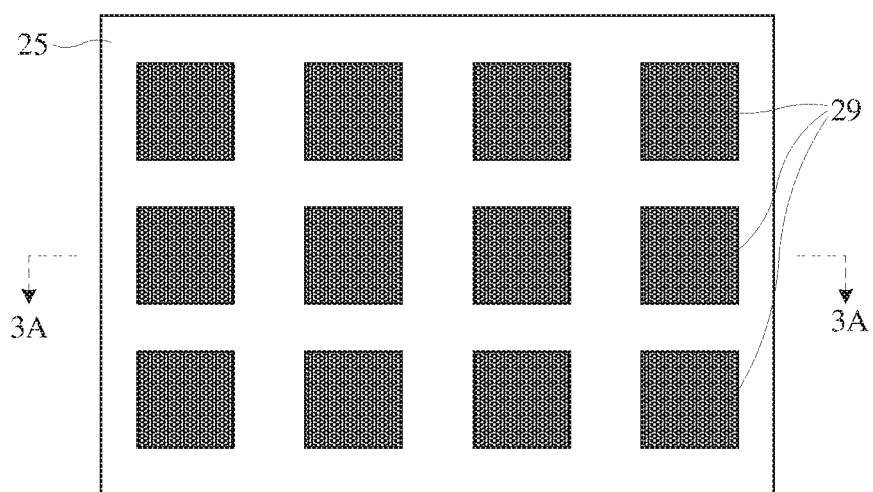

FIG. 3A illustrates a cross-sectional view of embodiment semiconductor devices that are a plurality of devices on a single substrate while FIG. 3B illustrates a top-sectional view of the embodiment semiconductor devices of FIG. 3A.

Referring to FIGS. 3A and 3B, a plurality of semiconductor devices are fabricated on the same substrate in an array configuration. In one embodiment, the individual semiconductor devices share a bottom contact 27 and have separate top contacts 29. For example, the top contacts 29 may include contacts to different regions of the device such as gate contacts and source contacts, which need to be isolated from each other. In another embodiment, the first doped layer 24 may partially be located between the spacers 20. Alternatively, the top contacts 29 may be restricted due to design rule limitations associated with the top metallization. A singulation process may be performed after finalizing the fabrication steps for the realization of the targeted device structure. The can be enabled, e.g., by dicing or laser treatment in the area, e.g., between the different top contacts.

Figure 4:
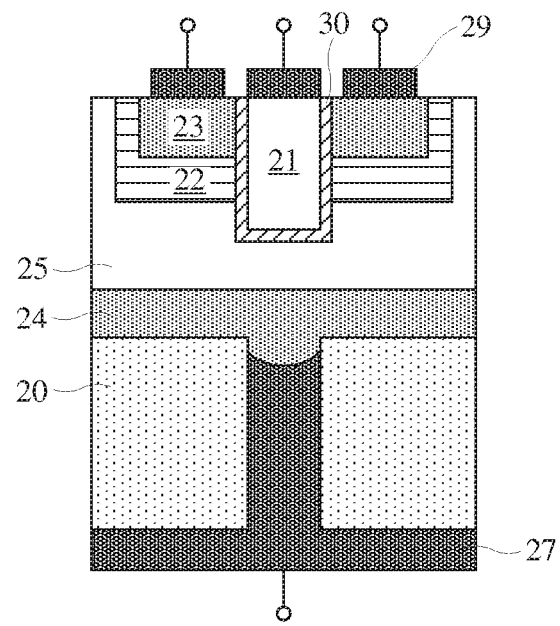
FIG. 4 illustrates a cross-sectional view of a semiconductor device having backside metal structures in accordance with an alternative embodiment of the present invention.
Figure 5:
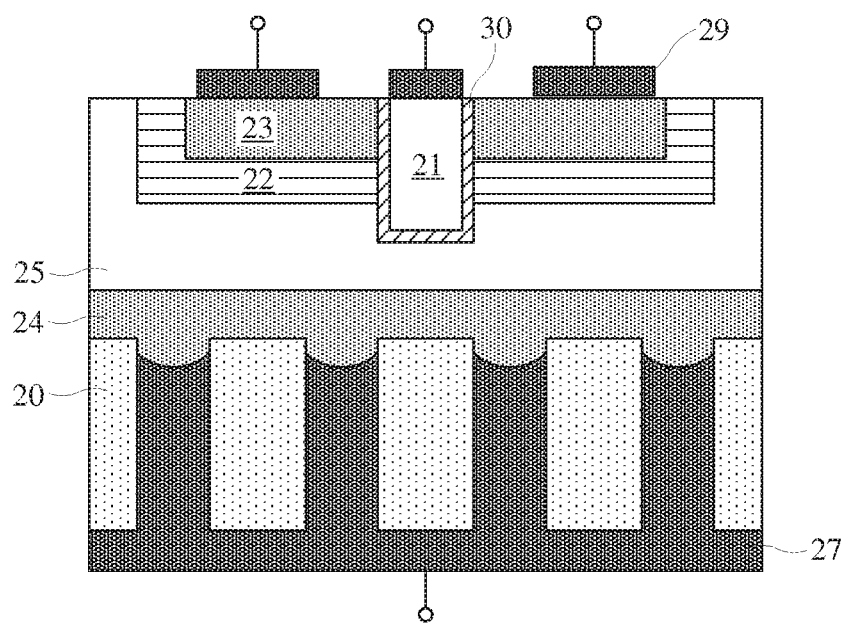
FIG. 5 illustrates a cross-sectional view of yet another alternative embodiment of the semiconductor device having backside metal structures.

FIGS. 4-5 illustrate embodiment semiconductor devices having backside metal structures in accordance with embodiments of the present invention. FIG. 4 illustrates a cross-sectional view of a trench gate MOSFET device while FIG. 5 illustrates a cross-sectional view of an alternative embodiment of a trench gate MOSFET device.

Referring to FIGS. 4 and 5, the semiconductor device comprises a bottom contact 27, semiconductor spacers 20, a first doped layer 24, a second doped layer 25, and a plurality of top contacts 29 as previously described. The semiconductor device further comprises a well region 22 disposed in the second doped layer 25. In one embodiment, the well region 22 has the opposite doping type of the second doped layer 25. Additionally, a doped region 23 is disposed within the well region 22. In one embodiment, the doped region 23 has the opposite doping type as the well region 22 and the same doping type as the second doped layer 25. Finally, a gate material 21 is disposed in the doped region 23 and the well region 22. The doped region 23 and well region 22 are separated from the gate material 21 by an insulating layer 30. In one embodiment, the gate material 21 is located directly over a bottom contact 27. Similar to other embodiments described previously, the first doped layer 24 may partially be located between the spacers 20.

In one embodiment, the first doped layer 24 and the second doped layer 25 are of the same doping type and the device is a trench gate metal oxide semiconductor field effect transistor (MOSFET). The trench gate MOSFET may be a power semiconductor device. In an alternative embodiment, the first doped layer 24 and second doped layer 25 are opposite doping types and the device is a trench gate insulated-gate bipolar transistor (IGBT).

Figure 6:
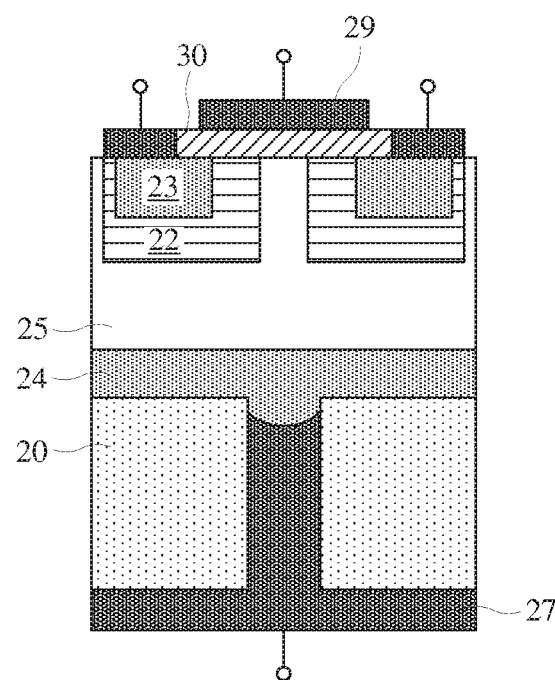
FIG. 6 illustrates a cross-sectional view of an embodiment semiconductor device having backside metal structures.
Figure 7:
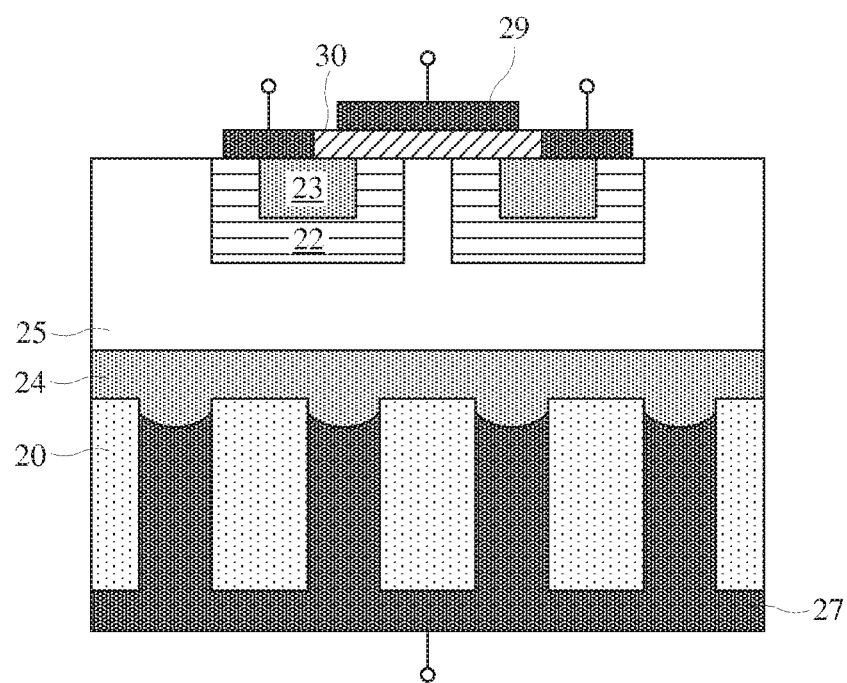
FIG. 7 illustrates a cross-sectional view of an alternative embodiment semiconductor device having backside metal structures.

FIGS. 6-7 illustrate embodiment semiconductor devices having backside metal structures in accordance with embodiments of the present invention. FIG. 6 illustrates a cross-sectional view of a planar MOSFET device while FIG. 7 illustrates a cross-sectional view of an alternative embodiment of a planar MOSFET device.

Referring to FIGS. 6 and 7, the semiconductor device comprises a bottom contact 27, semiconductor spacers 20, a first doped layer 24, a second doped layer 25, and a plurality of top contacts 29 with doped region 23 and well region 22 as previously described. In contrast to previous embodiments, the semiconductor device further comprises an insulating layer 30 disposed on top of the doped region 23 and the well region 22 beneath a top contact 29. In one embodiment, a top contact 29 positioned above the insulating layer 30 forms the gate of a transistor.

Similar to previous embodiments, the device is a planar power MOSFET if the first doped layer 24 and the second doped layer 25 are the same doping type in one embodiment, and the device is a planar IGBT if the first doped layer 24 and the second doped layer 25 are different doping types in an alternative embodiment. Similar to other embodiments described previously, the first doped layer 24 may partially be located between the spacers 20.

Figure 9A:
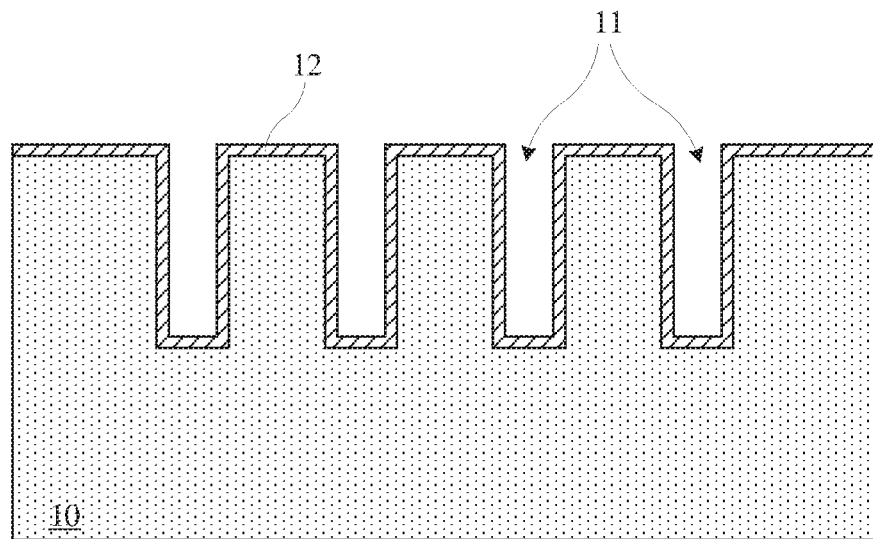
Figure 9B:
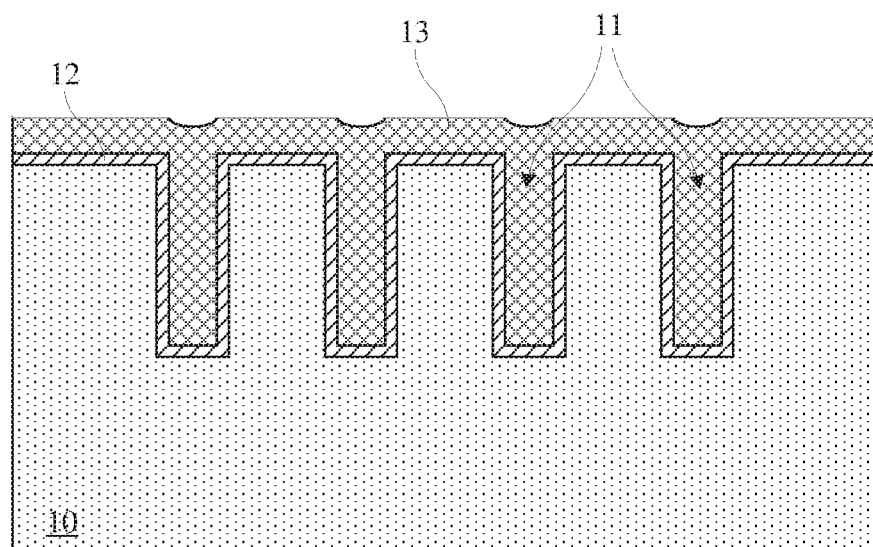
Figure 9C:
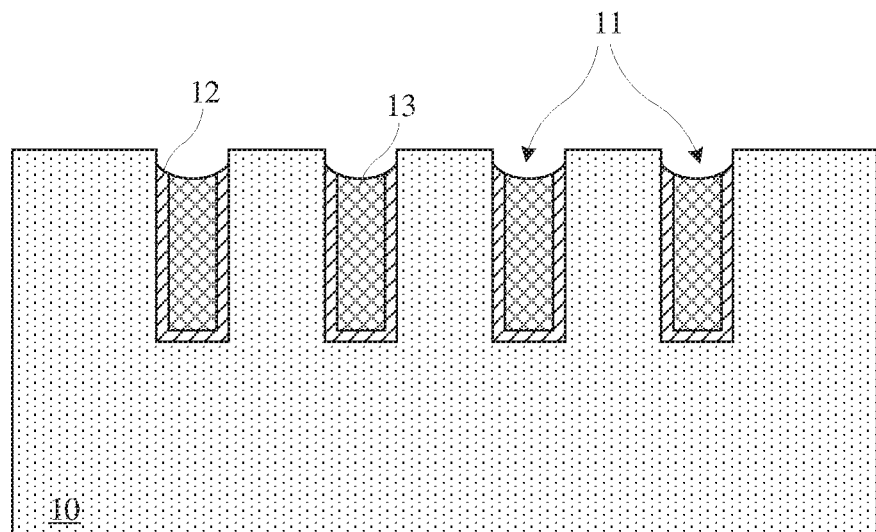
Figure 9D:
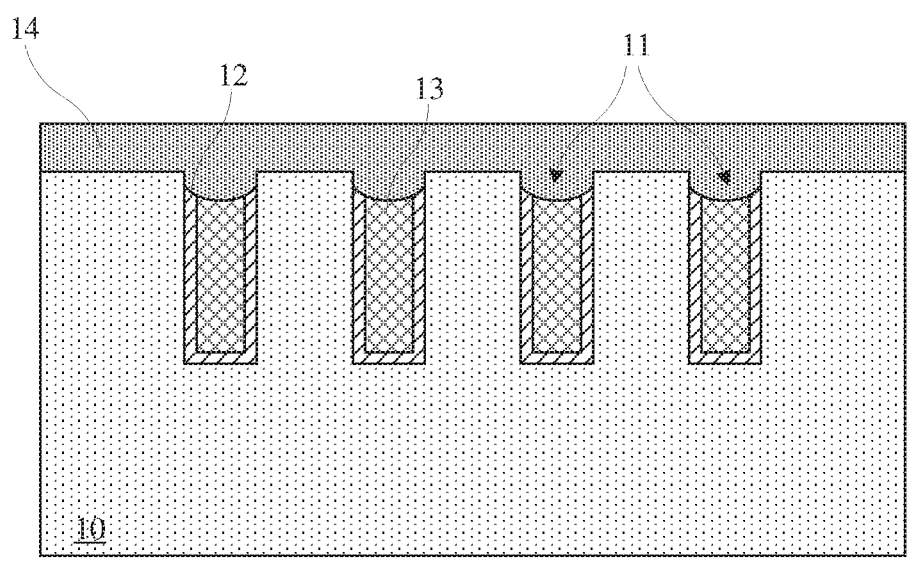
Figure 9E:
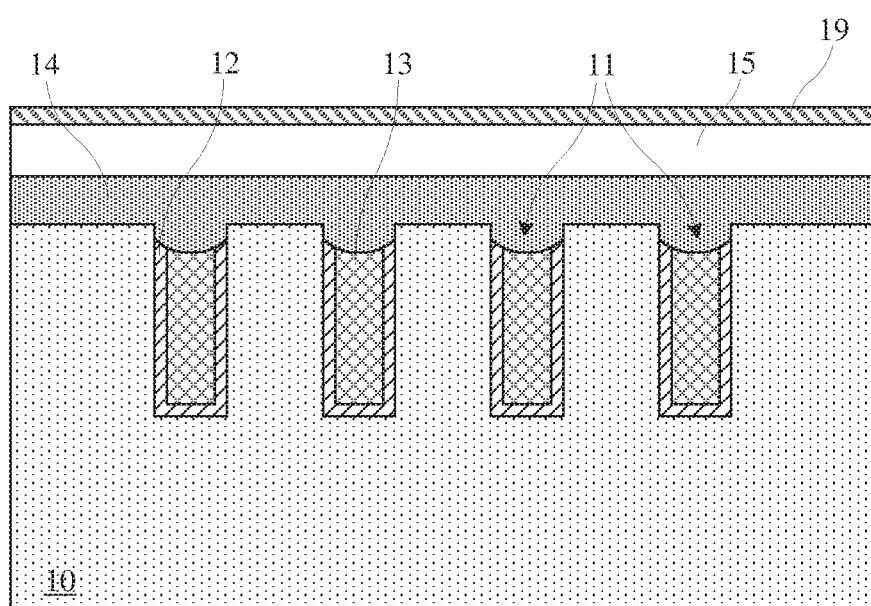
Figure 9F:
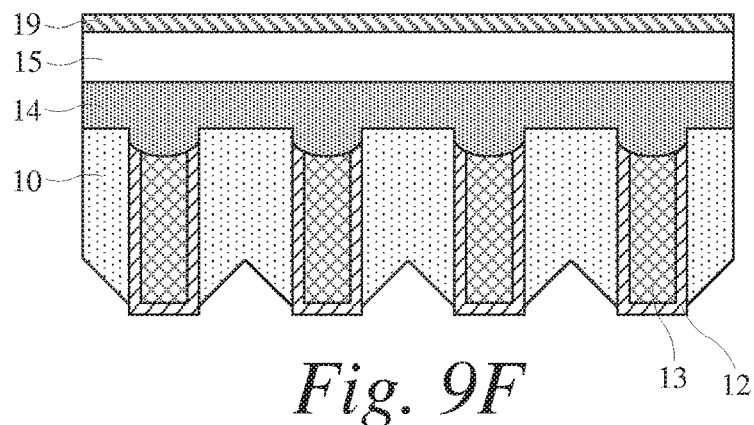
Figure 9G:
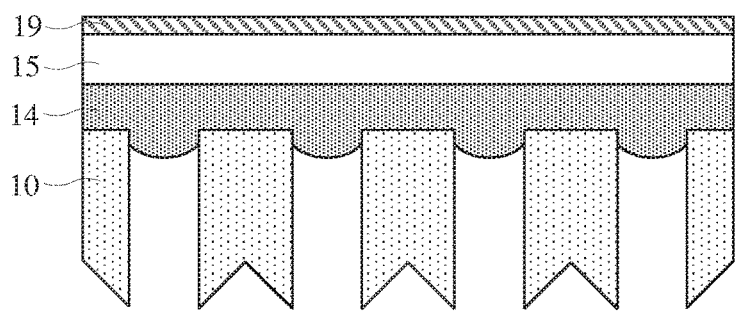
Figure 9H:
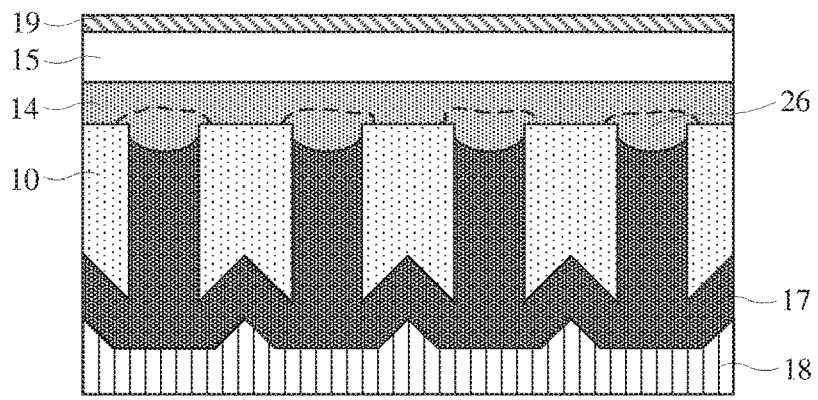
Figure 10A:
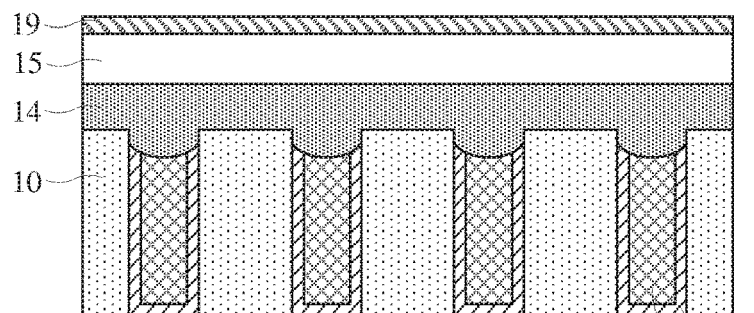
Figure 10B:
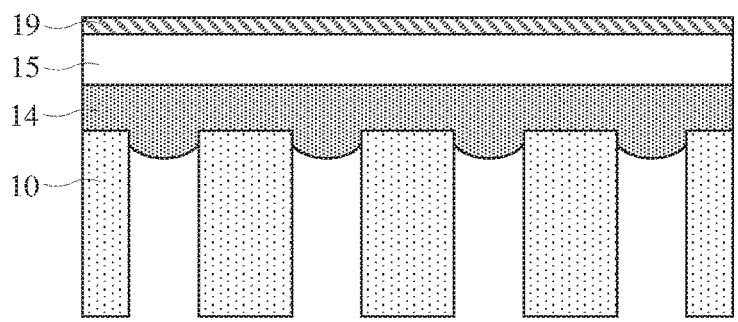
Figure 10C:
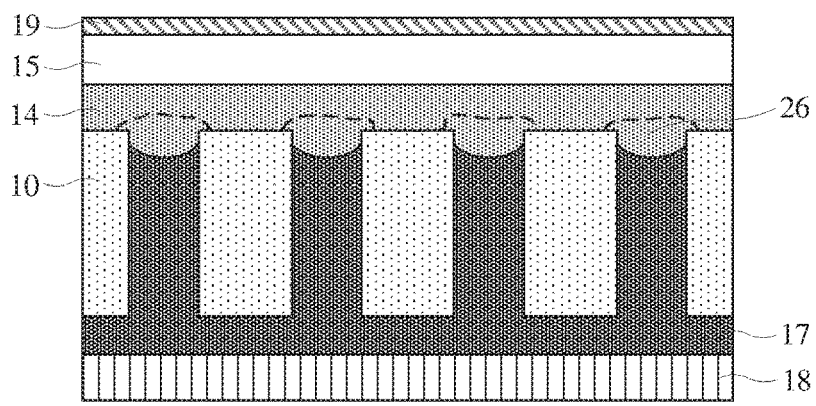

Although the embodiments illustrated in FIGS. 1-7 are structures formed using the method described in FIGS. 10A-10C, the structural embodiments also include structures corresponding to FIGS. 1-7 formed using the methods described in FIGS. 9A-9H, 11A-11C, 12A-12C, and 13A-13C.

FIGS. 8A-8D and 9A-9H illustrate an embodiment of forming a substrate comprising backside metal structures using BOX structures in accordance with an embodiment of the present invention.

Figure 8A:
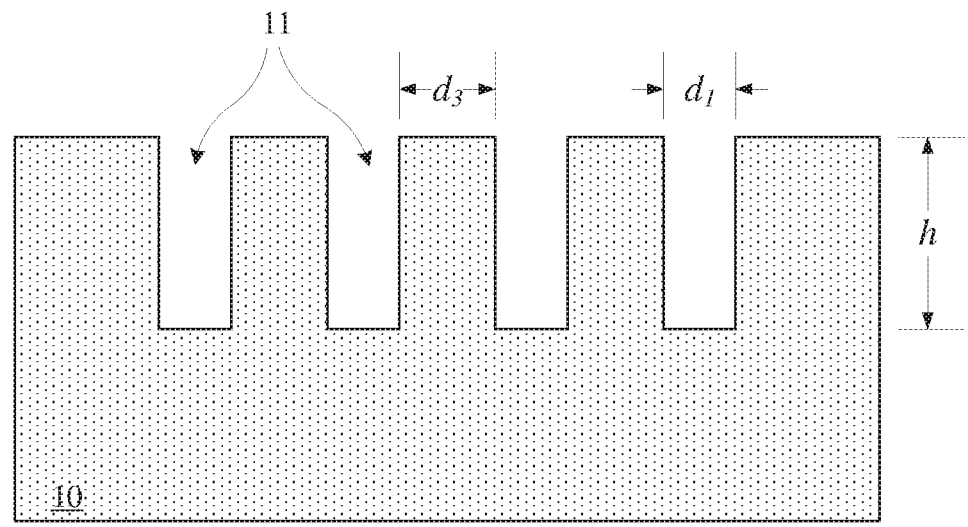

FIG. 8A illustrates a cross-sectional view of a substrate after forming deep trenches in accordance with an embodiment of the present invention.

Referring to FIG. 8A, a plurality of deep trenches 11 are formed within a substrate 10. In various embodiments, the substrate 10 is a semiconductor substrate. In various embodiments, the substrate 10 may be a silicon substrate, germanium substrate or may be a compound semiconductor substrate including indium antimonide, indium arsenide, indium phosphide, gallium nitride, gallium antimonide, gallium arsenide, silicon carbide, or combinations thereof. In various embodiments, the substrate 10 is a silicon substrate and highly doped, in one embodiment. The highly doped substrate 10 may have a concentration of at least about $10^{19}$ cm$^{-3}$ in silicon. In an alternative embodiment, the substrate 10 is a silicon wafer with a highly doped epitaxial layer on top. In another alternative embodiment, the substrate 10 is a silicon wafer that is highly doped using diffusion. For example, a doped layer is deposited over the undoped substrate and the substrate annealed so as to diffuse the dopants from the doped layer into the undoped substrate.

In various embodiments, the deep trenches 11 are formed in the substrate 10 using an etching process. In various embodiments the etching process is a reactive ion etching (RIE) process and a deep RIE process such as the BOSCH process in one embodiment. The deep trenches 11 may be formed with a high aspect ratio having nearly vertical, well-defined sidewalls. In some cases, the sidewalls may be reentrant having an angle between 88° and 90° relative to the substrate surface or retrograde having an angle between 90° and 92° relative to the substrate surface. In some embodiments, the etching process creates periodic undulating sidewalls.

Figure 8B:
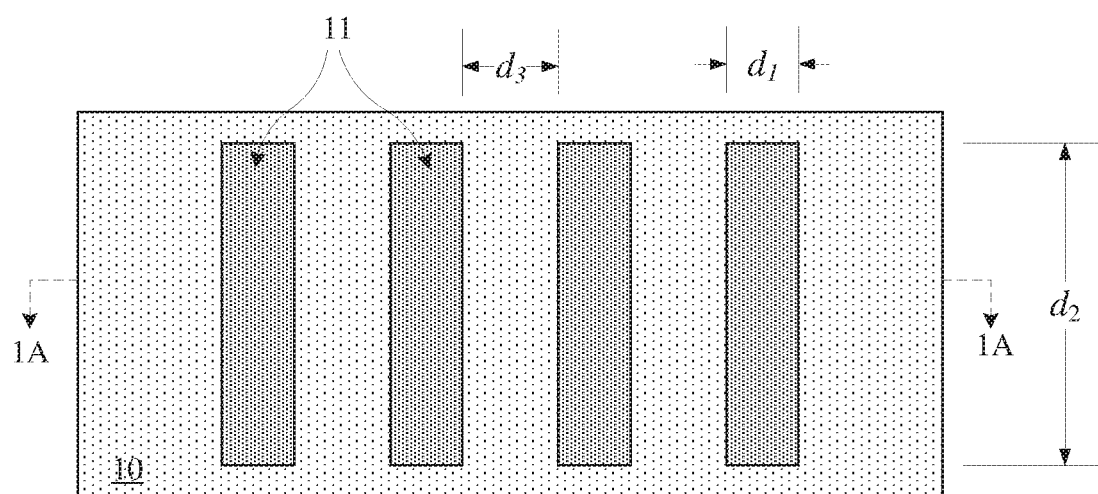
Figure 8C:
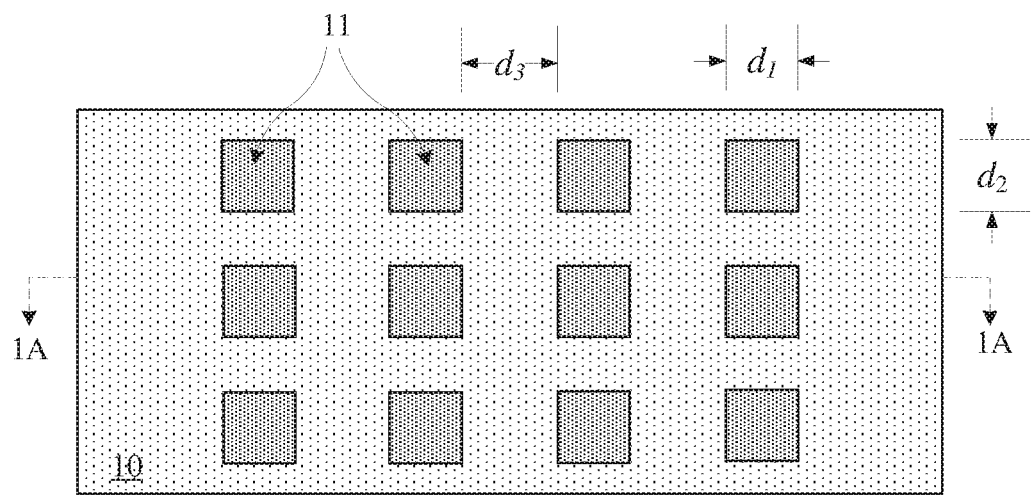
Figure 8D:
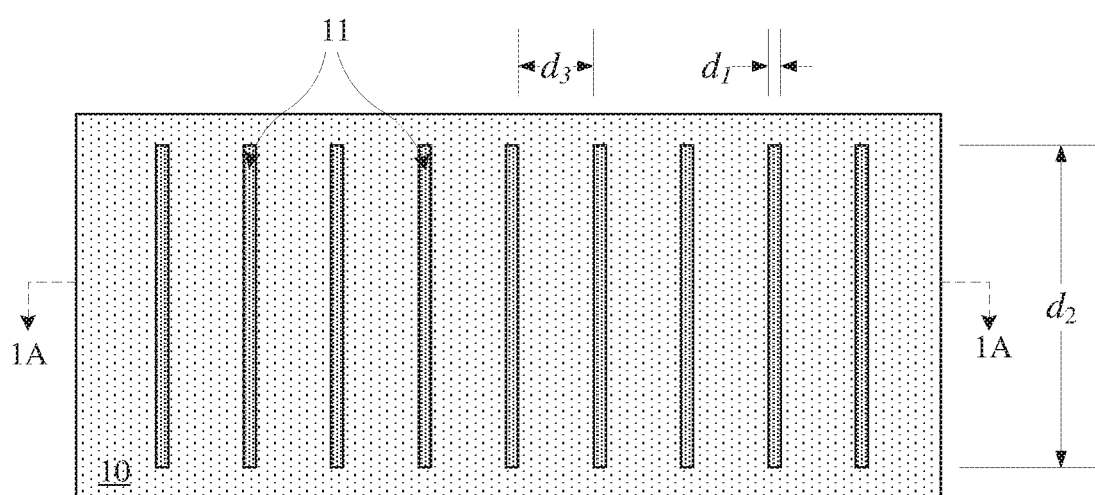

FIG. 8B illustrates an embodiment of a top view of the substrate after forming the deep trenches while FIGS. 8C and 8D illustrate alternative embodiments of a top view of the substrate after forming the deep trenches.

Referring to FIGS. 8A-8D, the deep trenches 11 have a width $d_1$, a length $d_2$, and a height h. The width $d_1$ is very thin and the height h is tall relative to the width $d_1$ in various embodiments. In one embodiment, the height h is between 0.3 μm and 5 μm. In various embodiments, the width $d_1$ may vary between 100 nm and 1000 nm and the height h may vary between 0.3 μm and 5 μm. The ratio h:$d_1$ ranges from 1:2 to 1:50 in various embodiments. In one embodiment, a ratio of the horizontal width $d_1$ to the vertical height h is about 1:10.

According to various embodiments the shape of the deep trenches 11 from a top view perspective are rectangles, squares, or lines as illustrated in FIGS. 8B, 8C, and 8D respectively. The deep trenches 11 are separated from each other by a distance $d_3$ that is similar to the width $d_1$ in some embodiments. In one embodiment, the ratio $d_1$:$d_2$ is about 1:1. Alternatively, the ratio $d_1$:$d_2$ is about 1:10 and on the order of 1:5000 in some embodiments. According to one embodiment, the ratio $d_1$:$d_3$ is about 1:1, and in some embodiments the ratio $d_1$:$d_3$ ranges from 1:3 to 1:10.

In one embodiment, the surface of the substrate 10 is on the (100) plane, and the lateral direction along the direction $d_1$ (in FIG. 8B), is along a [100] direction. However, in an alternative embodiment, the lateral direction along the direction $d_1$ (in FIG. 8B), is along [110] direction.

FIG. 9A illustrates a cross-sectional view of the substrate after forming a liner in accordance with embodiments of the present invention.

Referring to FIG. 9A, a liner 12 is formed on the surfaces of the substrate 10 and the deep trenches 11. The liner 12 is thin relative to the width $d_1$ of the deep trenches 11 such that an opening exists in the deep trenches 11 after forming the liner 12. For example, the liner 12 may be between 1% and 20% of the width $d_1$. In various embodiments, the liner 12 is conformal to the surface and forms a layer on the surface of the substrate 10 and on the sidewalls and bottom surface of the deep trenches 11.

The liner 12 may be formed using a deposition process or a thermal process. In one embodiment, the liner 12 is formed using a thermal oxidation process by subjecting the surface of the exposed substrate 10 to an oxidizing atmosphere. Alternatively, the liner 12 may be formed using a thermal nitridation, chemical vapor deposition (CVD), plasma enhanced CVD, chemical solution deposition, physical vapor deposition, and atomic layer deposition although other deposition process such as molecular beam epitaxy, sputter deposition, and spin coating may also be used in some embodiments. The liner 12 may be an oxide, nitride, or other material in various embodiments.

FIG. 9B illustrates a cross-sectional view of the substrate after formation of a fill layer in accordance with embodiments of the present invention.

Referring to FIG. 9B, a fill layer 13 is formed on top of the liner 12. In one embodiment, the fill layer 13 is formed using a chemical vapor deposition (CVD) process. In alternative embodiments, the fill layer 13 may be formed using thermal oxidation, thermal nitridation, plasma enhanced CVD, chemical solution deposition, physical vapor deposition, atomic layer deposition, molecular beam epitaxy, sputter deposition, and spin coating. According to various embodiments, the fill layer 13 is a thermal oxide, a deposited oxide, a nitride, a ternary carbide, a ternary nitride, a metal, or graphite, for example. In one embodiment, the fill layer 13 is a CVD oxide. In various embodiments, the liner 12 and the fill layer 13 have similar etch selectivity so as to be etched simultaneously.

Figure 11A:
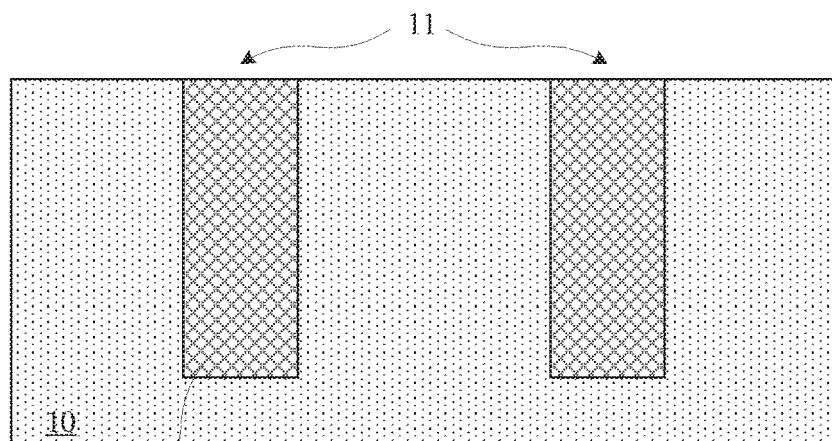
Figure 11B:
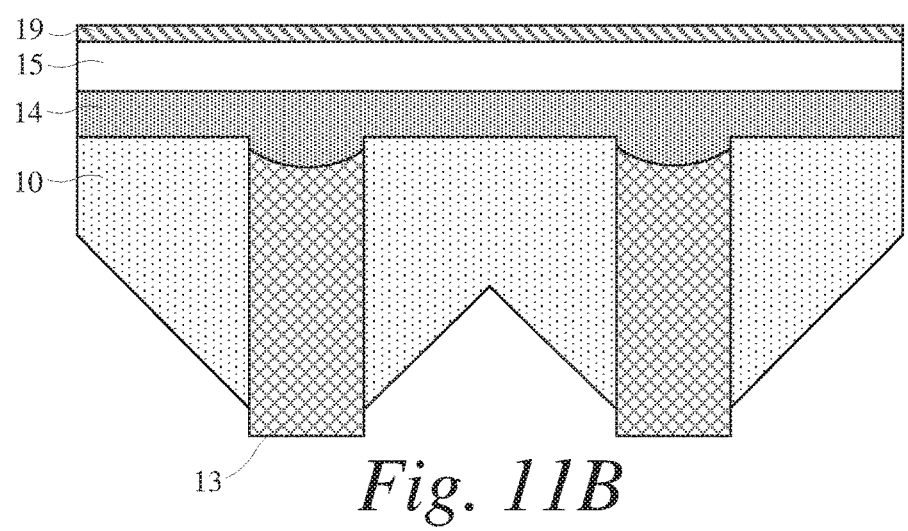
Figure 11C:
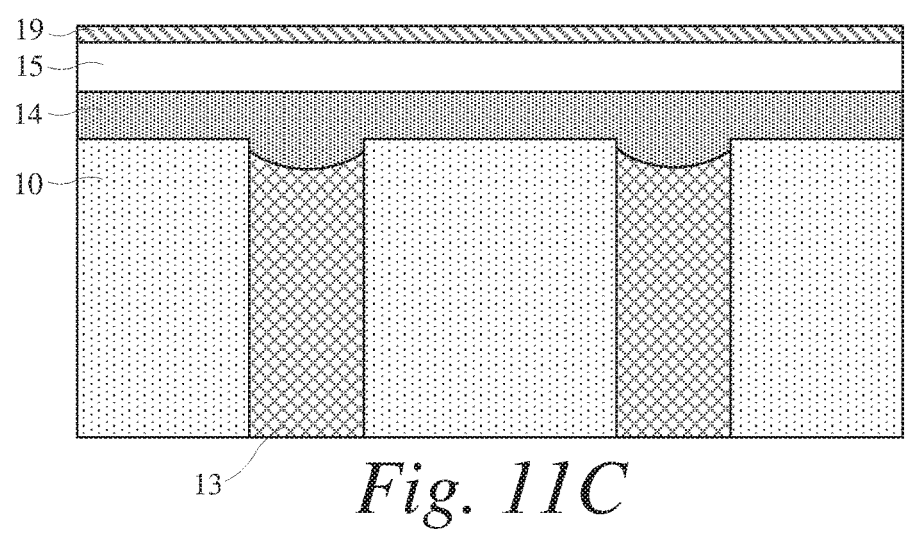

As previously mentioned, the liner 12 may be omitted and a fill layer 13 is directly deposited in some embodiments. The fill layer 13 may be a ternary carbide, a ternary nitride, or a metal. FIGS. 11A-11C are illustrations of these embodiments and will be subsequently described in greater detail.

FIG. 9C illustrates a cross-sectional view of the substrate after removing regions of the fill layer and the liner to expose a surface of the substrate in accordance with an embodiment of the present invention.

Referring to FIG. 9C, the fill layer 13 and the liner 12 are removed from the surface of the substrate 10 and at least partially into the deep trenches 11 as illustrated. According to various embodiments, an etching process is used that is specific to the fill layer 13 and the liner 12 and does not etch the substrate 10. The etching process is a wet chemical etch in some embodiments. Alternatively, a chemical mechanical planarization (CMP) process may be used to planarize the top surface down to the substrate 10 surface followed by etching the fill layer 13 and the liner 12. A sidewall surface of the substrate 10 and a top surface of the substrate 10 is obtained after the etching process exposing the semiconductor material.

In various embodiments, the fill layer 13 and the liner 12 form BOX structures that are very thin and tall having well-defined sidewalls and a planar top surface over small distances. This is a result of the precise dimensionality of the deep trenches 11 and allows the BOX structures to be used as a reproducible etch stop with low total thickness variation. Additionally, various embodiments of the present invention expose only a top planar surface of the BOX structure prior to an ELO processing step.

FIG. 9D illustrates a cross-sectional view of the substrate after forming a first epitaxial layer in accordance with an embodiment of the present invention.

Referring to FIG. 9D, a first epitaxial layer 14 is formed using an epitaxial lateral overgrowth (ELO) process on top of the remainder of the fill layer 13 and the liner 12 and over the substrate 10. The ELO process is a method of growing an epitaxial layer beginning at a seed material and proceeding laterally over a partially masked substrate. In various embodiments, the fill layer 13 and the liner 12 are a mask for the ELO process and the top surfaces of the substrate 10 are the seed material. In one or more embodiments, the first epitaxial layer 14 may be grown using a vapor phase epitaxy process. In other embodiments, a liquid phase epitaxy process may also be used.

The ELO process nucleates at the top surfaces and the sidewalls of the substrate 10 and thus begins directly at the top surfaces of the fill layer 13 and the liner 12. This is a result of the fill layer 13 and the liner 12 being entirely within a part of the deep trenches 11 which is in contrast to the conventional methods of forming BOX structures described previously. Advantageously, the first epitaxial layer 14 grows laterally over the surfaces of the fill layer 13 and the liner 12 and there are no rough surfaces generating crystal defects. Furthermore, only the top surface and the upper part of the trench need be covered by the epitaxial layer which results in much lower ELO processing time compared to conventional BOX structure formation methods.

As the first epitaxial layer 14 is forming, growth occurs in directions normal to the top surfaces and sidewall surfaces of the substrate 10. The formation of the first epitaxial layer 14 buries the fill layer 13 and the liner 12 creating BOX structures within the substrate 10. After some time, the independent epitaxial growth formations of each BOX structure meet and coalesce forming a continuous layer on top of the substrate 10. The amount of time before a continuous layer is formed is determined by the spacing of the BOX structures and the specific processing parameters for a given ELO layer.

In one embodiment, only the deep trenches 11 are filled by the first epitaxial layer 14 up to a top surface of the substrate 10. In an alternate embodiment, the deep trenches 11 are filled and the epitaxial growth continues laterally across the substrate 10 resulting in a uniform crystalline, defect-free first epitaxial layer 14 covering the substrate 10. In various embodiments the first epitaxial layer 14 has the same material composition as the substrate 10. Alternatively, the first epitaxial layer 14 has a different material composition than the substrate 10. In various embodiments, the first epitaxial layer 14 is silicon and is highly doped in one embodiment.

FIG. 9E illustrates a cross-sectional view of the substrate after formation of a second epitaxial layer in accordance with an embodiment of the present invention.

Referring to FIG. 9E, a second epitaxial layer 15 is formed on top of the first epitaxial layer 14. The process of forming the second epitaxial layer 15 may be different than the process used to form the first epitaxial layer 14. Further, in various embodiments, the second epitaxial layer 15 has a different material composition than the first epitaxial layer 14 or the substrate 10. In one embodiment, the substrate 10, the first epitaxial layer 14, and the second epitaxial layer 15 have the same material composition. In various embodiments, the second epitaxial layer 15 is silicon.

According to various embodiments, the second epitaxial layer 15 is lightly doped and a device layer in one embodiment. In one embodiment, the second epitaxial layer 15 serves as a drift zone for a semiconductor device. Additionally, other regions such as source regions may be formed within the second epitaxial layer 15 during subsequent processing. In additional embodiments, an optional buffer layer is included on top of or beneath the second epitaxial layer 15.

Various additional doped regions, contacts, and metallization layers may be formed in accordance with specific device requirements for the completion of front-end processing of the substrate. In some embodiments, the front side of the substrate may be covered with a passivation layer 19, for example, a thick oxide layer, as shown in FIG. 9E to protect the front side during subsequent backside processing.

FIG. 9F illustrates a cross-sectional view of the substrate comprising BOX structures after exposure of the BOX structures using an etching step in accordance with an embodiment of the present invention.

Referring to FIG. 9F, the BOX structures comprising the liner 12 and the fill layer 13 are used as an etch stop during an etching process that is selective to the substrate 10. According to various embodiments, the etching process is performed from the backside of the substrate 10 opposing the first epitaxial layer 14. This backside etching serves to thin the wafer and expose the bottom surface of the BOX structures. According to various embodiments, the etching process is a crystal-oriented wet etch. For example, the crystal-oriented wet etch may be a tetramethylammonium hydroxide (TMAH) etch or a potassium hydroxide (KOH) etch. The crystal-oriented wet etch is an anisotropic etch that is selective to the (100) crystal plane and proceeds in between the BOX structures until only (111) surfaces (or orthogonally equivalent) remain. The resulting substrate 10 surfaces are rough in comparison to the wafer thinning method that will be subsequently described.

Precise control over the distances $d_1$, $d_3$, and h improves the accuracy of crystal-oriented wet etches that use BOX structures as an etch stop over the conventional BOX structure formation methods as described previously. Advantageously, the small dimensionality of the lateral distances $d_1$ and $d_3$ as well as the height h of the BOX structures allow for the two (111) planes to meet which greatly reduces the etch rate of the etching process of the substrate 10 from between the BOX structures. The etching process can then be terminated during the period after the etching process has slowed down. Thus, the substrate 10 may be controllably etched to expose the BOX structures without completely removing the substrate 10 from between the BOX structures.

FIG. 9G illustrates a cross-sectional view of the substrate after removal of the BOX structures using an etching step in accordance with an embodiment of the present invention.

According to various embodiments, the BOX structures may be removed using a wet etch that selectively targets oxide materials such as a hydrofluoric acid (HF) etch or a buffered oxide etch comprising ammonium fluoride ($NH_4F$) and HF. Alternatively, the BOX structures may be removed using a plasma etch technique with etchants such as $CF_4$, $SF_6$, or $NF_3$.

FIG. 9H illustrates a cross-sectional view of the substrate after deposition of a metal layer in accordance with an embodiment of the present invention.

Referring to FIG. 9H, a metal 17 is deposited, filling the spaces formerly occupied by the BOX structures. Optionally, according to various embodiments, a dopant implantation step followed by a subsequent annealing step such as laser annealing, for example, may be performed prior to the deposition of the backside metal 17. The dopant implantation step results in an implantation region 26 within the first epitaxial layer 14. This provides good Ohmic contact or a backside emitter for devices. Optionally, a diffusion barrier layer (not shown) may be formed prior to the deposition of the backside metal 17.

Since the backside metal 17 fills the spaces left by the removal of the BOX structures, the shape and dimensionality of the backside metal 17 is similar to that described previously regarding the BOX structures. The bottom surface of the backside metal 17 may exhibit the v-shaped topography of the substrate 10 as shown in FIG. 9H.

According to various embodiments, the backside metal 17 comprises a pure metal, a metal carbide, a metal nitride, and metal silicides, for example. In one embodiment, the backside metal 17 is a ternary carbide. In another embodiment, the backside metal 17 is a ternary nitride. In various embodiments, the backside metal 17 comprises titanium, tungsten, nickel, chromium, vanadium, tin, silver, copper, or aluminum.

The backside metal 17 provides stability to the structures and reduces warping of the first epitaxial layer 14 and the second epitaxial layer 15. Additionally, the added stability helps to avoid the peeling of the metal from the substrate 10 that occurs on flat surfaces.

In various embodiments, an optional backside metal layer 18 is formed over the metal 17. According to various embodiments, the backside metal layer 18 is deposited via sputtering, vapor deposition, printing, electroplating, electroless plating, for example.

The removal of the BOX structures to form well-defined metal structures promotes higher stabilization of ultra-thin wafers and dies. The metal 17 and backside metal layer 18 also provides thermal conductivity and vertical electrical conductivity down to the backside metallization for devices.

Subsequent processing continues as in conventional semiconductor processing. For example, if needed the passivation layer is removed or patterned to expose front side contacts, and the substrate 10 is diced to form individual semiconductor dies.

A singulation process may be performed after finalizing the fabrication steps for the realization of the targeted device structure. The singulation may be performed using mechanical dicing or laser treatment in the area between the different top contacts.

FIGS. 10A-10C illustrate a method of forming a substrate comprising metal structures using BOX structures in accordance with alternative embodiment of the present invention.

FIG. 10A illustrates a cross-sectional view of a substrate comprising BOX structures after exposure of the BOX structures using a chemical mechanical planarization (CMP) step in accordance with an embodiment of the present invention.

Referring to FIG. 10A, the BOX structures are formed as described in FIGS. 8A and 9A-9E. The backside surface of the substrate 10 is then removed using a CMP process until reaching the bottom surface of the BOX structures. The resulting substrate 10 surface is smooth in contrast to the roughly etched surface of previously described embodiments. Additionally, CMP polished surfaces are planar, rather than the v-shaped surfaces illustrated in FIGS. 9F-9H. Backside wafer thinning using CMP may be used for vertical metal-oxide-semiconductor (MOS) and insulated-gate bipolar transistor (IGBT) structures and devices, for example.

FIG. 10B illustrates a cross-sectional view of a substrate after removal of BOX structures using an etching step in accordance with an embodiment of the present invention.

As described previously, the etching of the BOX structures may be performed similar to that described using FIG. 9G.

FIG. 10C illustrates a cross-sectional view of a substrate after deposition of metal layers in accordance with an embodiment of the present invention.

Referring to FIG. 10C, the deposition of metal structures are similar to that described in FIG. 9H.

FIGS. 11A-11C illustrate an alternative embodiment of forming BOX structures.

FIG. 11A illustrates a cross-sectional view of a substrate comprising deep trenches filled with a fill layer in accordance with embodiments of the present invention.

Referring to FIG. 11A, in various embodiments, a plurality of deep trenches 11 are formed in a substrate 10 according to methods described previously herein. In further embodiments, the processing step of forming a liner on the substrate 10 and on the surfaces of the deep trenches 11 is skipped and the liner is omitted. Accordingly, the deep trenches 11 in the substrate 10 are filled only with a fill layer 13. As before, the fill layer 13 may be a thermal oxide, a deposited oxide, a nitride, graphite, for example.

FIG. 11B illustrates a cross-sectional view of the substrate comprising BOX structures after exposure of the BOX structures using an etching step in accordance with an embodiment of the present invention.

FIG. 11C illustrates a cross-sectional view of the substrate comprising BOX structures after exposure of the BOX structures using a CMP step in accordance with an embodiment of the present invention.

Referring to FIGS. 11B and 11C, the substrate 10 including the BOX structures comprising a fill layer 13 is processed in a similar manner as described in FIGS. 9C-9E. In one embodiment, the substrate 10 is then thinned using a crystal-oriented etching process as previously described and illustrated in FIG. 9F. This results in an analogous formation illustrated in FIG. 11B. Alternatively, the substrate 10 is thinned using a CMP process as previously described and illustrated in FIG. 10B. This results in an analogous formation illustrated in FIG. 11C. Subsequent processing to remove the BOX structures comprising a fill layer 13 proceeds as previously described and produces formations that are identical to that of FIG. 9G and FIG. 10B respectively.

Figure 12A:
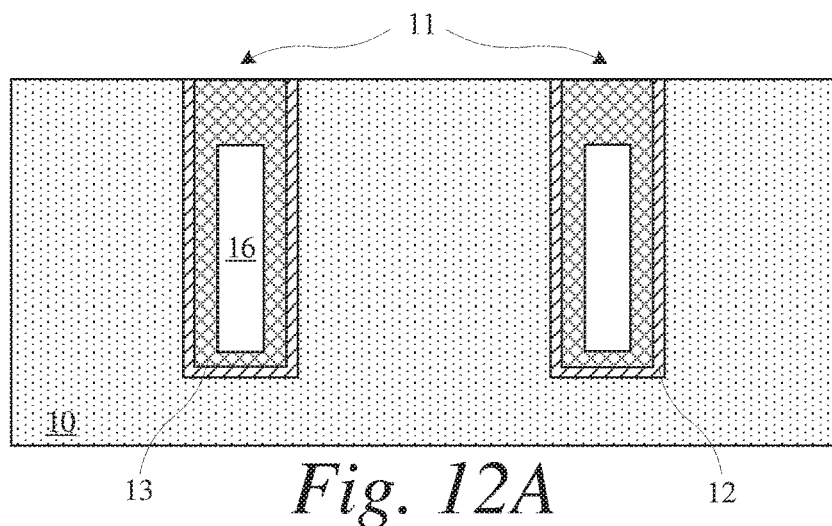
Figure 12B:
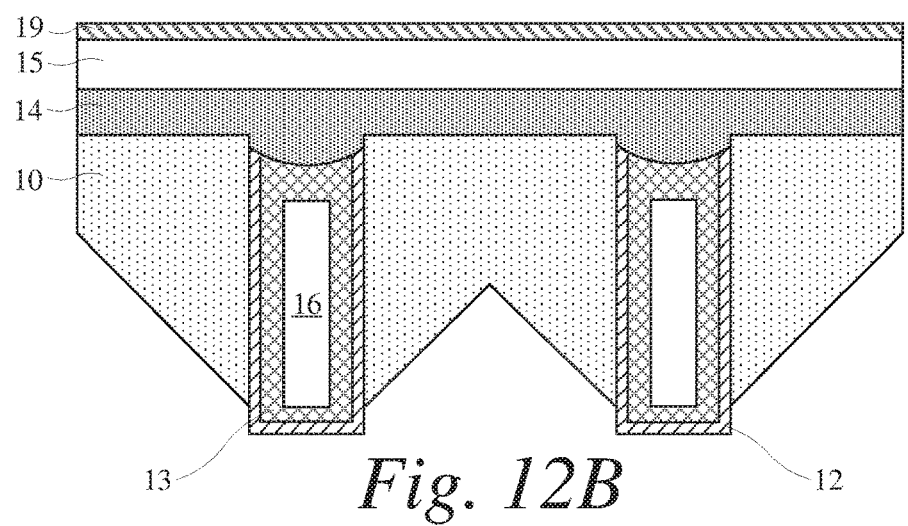
Figure 12C:
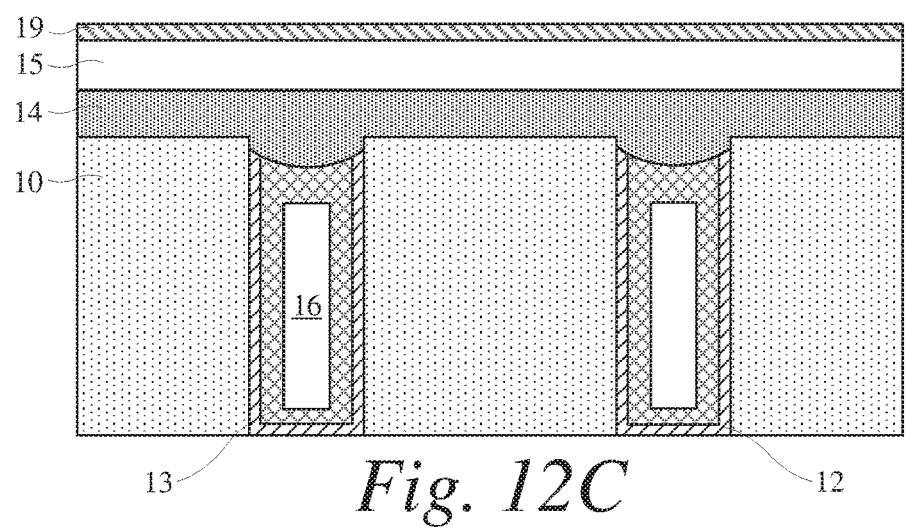

FIGS. 12A-12C illustrate an alternative embodiment of forming BOX structures in accordance with embodiments of the present invention.

FIG. 12A illustrates a cross-sectional view of a substrate comprising deep trenches filled with a liner and a fill layer and having a void region within the fill layer in accordance with an embodiment of the present invention.

Referring to FIG. 12A, in various embodiments, a plurality of deep trenches 11 are formed in a substrate 10 according to methods described previously herein. In further embodiments, the fill layer 13 is formed in the deep trenches 11 and only covers the sidewalls, top, and bottom of the deep trenches 11 leaving a void region 16 within a central area of the fill layer 13. According to various embodiments, the void region 16 is a narrow, elongated bubble zone within the fill layer 13. In an alternative embodiment, a plurality of voids may be formed within one or more of the deep trenches 11.

FIG. 12B illustrates a cross-sectional view of the substrate comprising BOX structures after exposure of the BOX structures using an etching step in accordance with an embodiment of the present invention.

FIG. 12C illustrates a cross-sectional view of the substrate comprising BOX structures after exposure of the BOX structures using a CMP step in accordance with an embodiment of the present invention.

Referring to FIGS. 12B and 12C, the substrate 10 including the BOX structures comprising a liner 12, a fill layer 13, and a void region 16 is processed in a similar manner as described in FIGS. 9C-9E. In further embodiments, subsequent processing utilizes crystal-oriented etching or CMP processes to produce analogous formations to FIG. 9F and FIG. 11B as illustrated in FIGS. 12B and 12C. As described previously, further processing to remove the BOX structures comprising a liner 12, a fill layer 13, and a void region 16 produces formations that are identical to that of FIG. 9G and FIG. 10B respectively.

FIGS. 13A-13D illustrates a semiconductor device during fabrication in accordance with an alternative embodiment of the present invention.

While prior embodiments used a metal last approach, embodiments of the present invention may use a metal first flow if the metal is amenable to the thermal budget used during the front end processing. Accordingly, in one embodiment, after forming the deep trenches 11, a metal liner 312 and contact metal 313 may be directly deposited into the deep trenches 11. The contact metal 313 may include metal nitride, metal carbides such as ternary nitrides, ternary carbides, graphite, carbon, and other materials that are immune to high temperature processing.

Figure 13A:
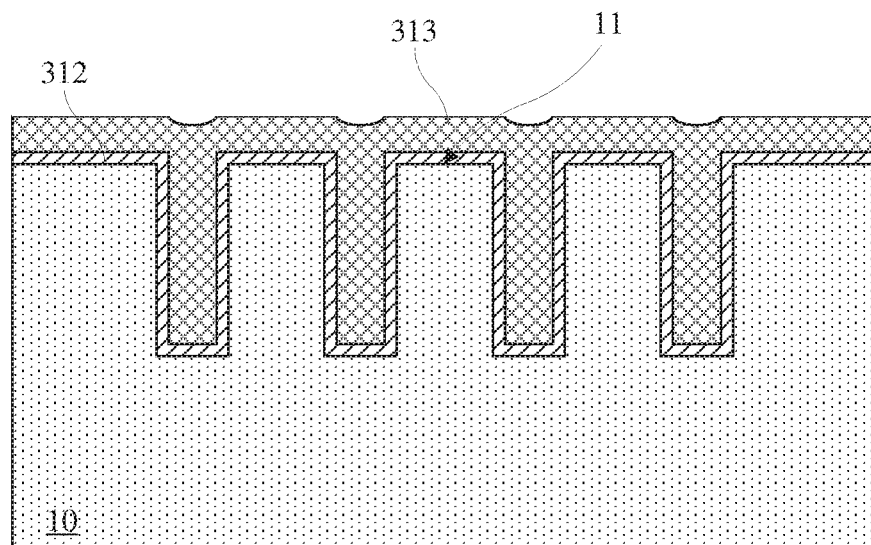
FIGS. 13A-13D illustrates a semiconductor device during fabrication in accordance with an alternative embodiment of the present invention.
Figure 13B:
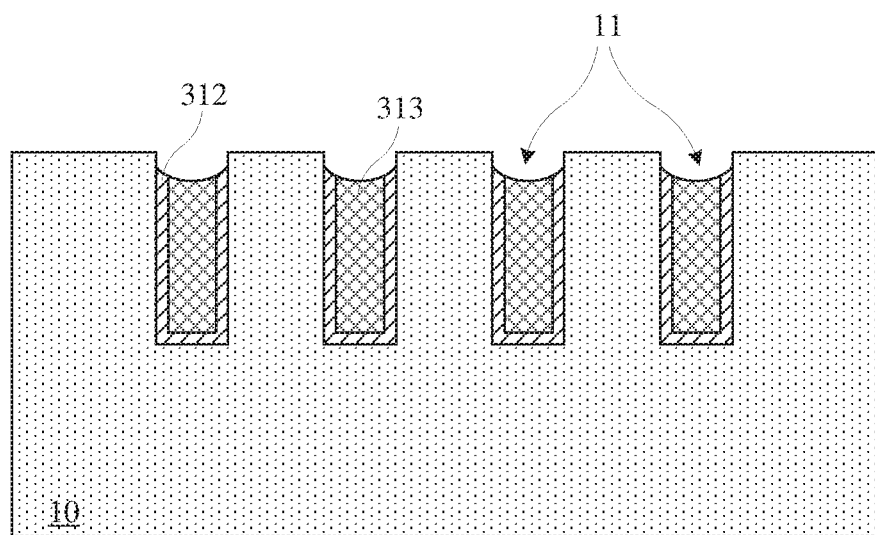
Figure 13C:
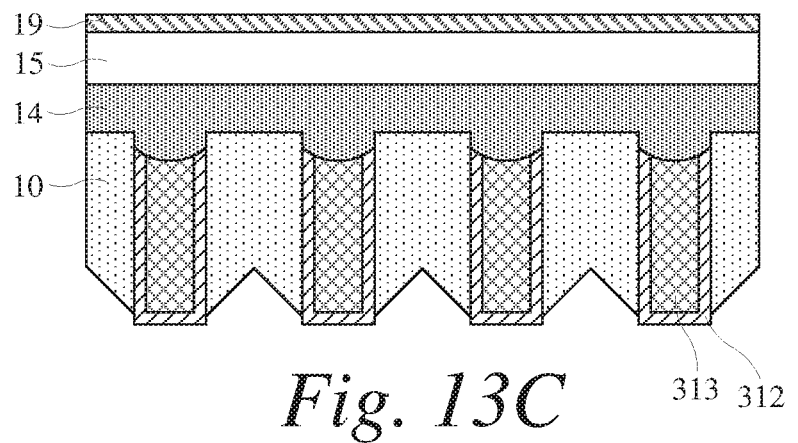
Figure 13D:
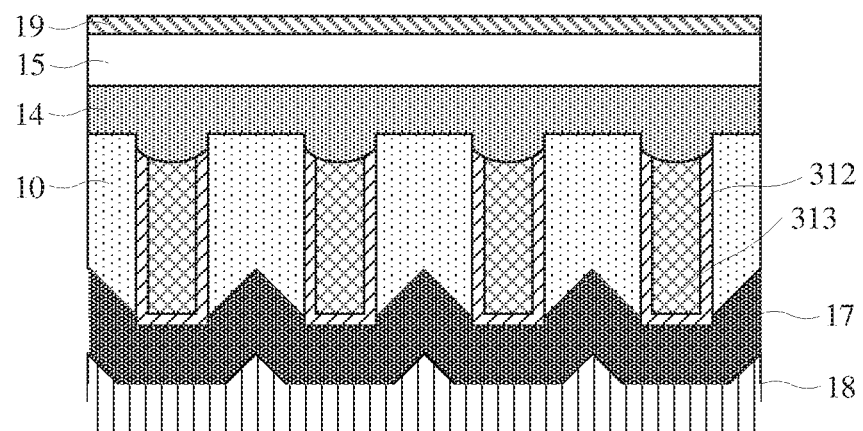

Further processing may proceed, as described in prior embodiments, for example, using FIGS. 9A-9H. For example, as next illustrated in FIG. 13B after polishing the metal liner 312 and the contact metal 313. FIG. 13C illustrates the device during back side processing after the anisotropic etch. The metal liner 312 has to be immune to the etchant that is being used to etch the substrate 10. Otherwise, the metal liner 312 will be removed during the etching. In alternative embodiment, the polishing process as described in FIGS. 10A-10C may be used for the back side thinning. Subsequent processing continues as described in prior embodiments. For example, as illustrated in FIG. 11D, the backside metal 17, and if needed the optional backside metal layer 18, are formed. Advantageously, in this embodiment, the deep trenches 11 are already filled with metal and therefore provide greater flexibility in forming the backside metal 17. For example, the stress optimization may be independently controlled since the metal from the backside metal 17 is not filling the deep trenches 11.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-13 may be combined with each other in alternative embodiments. It is therefore intended that the appended claims encompass any such modifications or embodiments.

What is claimed is:

1. A semiconductor device comprising:
a first epitaxial layer;
a second epitaxial layer disposed below the first epitaxial layer;
a conductive layer disposed below and directly contacting the second epitaxial layer, the conductive layer comprising a metal; and
a plurality of spacers disposed between the second epitaxial layer and the conductive layer, the plurality of spacers comprising a bulk semiconductor material, the second epitaxial layer partially extending vertically in between ones of the plurality of spacers.

2. The semiconductor device of claim 1, wherein:
the first epitaxial layer comprises a first doping type; and
the second epitaxial layer comprises a second doping type that is opposite of the first doping type.

3. The semiconductor device of claim 1, wherein:
the first epitaxial layer comprises a device region;
the conductive layer comprises a back side contact of the semiconductor device; and
the semiconductor device is a vertical device.

4. The semiconductor device of claim 1, wherein the conductive layer makes direct contact with the second epitaxial layer at exactly one single contact surface.

5. The semiconductor device of claim 1, wherein the conductive layer makes direct contact with the second epitaxial layer at a plurality of contact surfaces.

6. The semiconductor device of claim 1, wherein:
the first epitaxial layer is lightly doped; and
the second epitaxial layer is highly doped relative to the first epitaxial layer.

7. A semiconductor device comprising:
a first epitaxial layer;
a conductive layer disposed below the first epitaxial layer;
a first spacer comprising a bulk semiconductor material;
a second spacer comprising the bulk semiconductor material;
a trench spatially separating the first spacer from the second spacer;
wherein the first spacer, the second spacer, and the trench are disposed between the first epitaxial layer and the conductive layer;
wherein the first epitaxial layer fills a portion of the trench; and
wherein the conductive layer extends into the trench filling the remaining portion of the trench and directly contacting the first epitaxial layer.

8. The semiconductor device of claim 7, further comprising a second epitaxial layer disposed over the first epitaxial layer, the second epitaxial layer comprising a device region.

9. The semiconductor device of claim 8, wherein:
the first epitaxial layer comprises a first doping type; and
the second epitaxial layer comprises a second doping type that is opposite of the first doping type.

10. The semiconductor device of claim 7, wherein the conductive layer comprises a metal.

11. The semiconductor device of claim 7, wherein:
the conductive layer comprises a back side contact of the semiconductor device; and
the semiconductor device is a vertical device.

12. The semiconductor device of claim 7, wherein the conductive layer directly contacts the first epitaxial layer at exactly one single contact surface.

13. The semiconductor device of claim 7, wherein the conductive layer directly contacts the first epitaxial layer at a plurality of contact surfaces.

14. A vertical semiconductor device comprising:
an epitaxial region;
a device region disposed in the epitaxial region;
a backside metal contact disposed below and directly contacting the epitaxial region; and
a plurality of spacers disposed between the epitaxial region and the backside metal contact, the plurality of spacers comprising a bulk semiconductor material, the epitaxial region partially extending vertically in between ones of the plurality of spacers.

15. The vertical semiconductor device of claim 14, wherein the epitaxial region comprises:
a first epitaxial layer partially extending vertically in between ones of the plurality of spacers; and
a second epitaxial layer comprising the device region, the second epitaxial layer being disposed over the first epitaxial layer.

16. The vertical semiconductor device of claim 14, wherein:
the plurality of spacers comprises exactly two spacers; and
the backside metal contact extends vertically in between the two spacers and directly contacts the epitaxial region at exactly one single contact surface.

17. The vertical semiconductor device of claim 14, wherein:
the plurality of spacers are spatially separated from one another by a plurality of openings;
the epitaxial region partially extends vertically into each of the plurality of openings; and
the backside metal contact extends into each of the plurality of openings to directly contact the epitaxial region in each of the plurality of openings.

18. The vertical semiconductor device of claim 14, further comprising:
a source region of a vertical metal-oxide-semiconductor field-effect transistor (MOSFET) disposed in the epitaxial region.

19. The vertical semiconductor device of claim 18, wherein the vertical MOSFET comprises a trench gate MOSFET comprising a trench gate disposed over an opening spatially separating adjacent spacers of the plurality of spacers.

20. The vertical semiconductor device of claim 1, wherein:
   the plurality of spacers comprises exactly two spacers; and
   the conductive layer extends vertically in between the two spacers and directly contacts the second epitaxial region at exactly one single contact surface.

* * * * *